(12) United States Patent
Kuibira et al.

(10) Patent No.: US 7,268,322 B2
(45) Date of Patent: Sep. 11, 2007

(54) SEMICONDUCTOR HEATING APPARATUS

(75) Inventors: Akira Kuibira, Itami (JP); Hirohiko Nakata, Itami (JP); Kenji Shinma, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 11/099,987

(22) Filed: Apr. 5, 2005

(65) Prior Publication Data

US 2005/0274325 A1    Dec. 15, 2005

(30) Foreign Application Priority Data

Apr. 8, 2004    (JP)    ............... 2004-113851

(51) Int. Cl.
*H05B 3/68*    (2006.01)
*C23C 16/00*    (2006.01)

(52) U.S. Cl. .................... 219/444.1; 118/724

(58) Field of Classification Search ............ 219/443.1, 219/444.1, 465.1, 466.1, 467.1, 538, 539, 219/543, 544, 546; 118/724, 725, 728
See application file for complete search history.

(56) References Cited

U.S. PATENT DOCUMENTS

| | | | | |
|---|---|---|---|---|
| 5,688,331 A | * | 11/1997 | Aruga et al. | 118/725 |
| 5,851,298 A | * | 12/1998 | Ishii | 118/728 |
| 5,904,872 A | * | 5/1999 | Arami et al. | 219/444.1 |
| 6,133,557 A | * | 10/2000 | Kawanabe et al. | 219/544 |
| 6,353,209 B1 | * | 3/2002 | Schaper et al. | 219/444.1 |
| 6,639,189 B2 | * | 10/2003 | Ramanan et al. | 219/444.1 |
| 6,753,508 B2 | * | 6/2004 | Shirakawa | 219/444.1 |
| 6,770,379 B2 | * | 8/2004 | Yushio et al. | 428/622 |
| 2003/0044589 A1 | * | 3/2003 | Niwa | 428/210 |
| 2003/0066587 A1 | * | 4/2003 | Yushio et al. | 156/89.15 |

FOREIGN PATENT DOCUMENTS

JP    2001-033484 A    2/2001

OTHER PUBLICATIONS

Patent Abstracts of Japan for JP 2001-033484 published Feb. 9, 2001.

* cited by examiner

*Primary Examiner*—Sang Paik
(74) *Attorney, Agent, or Firm*—Darby & Darby (57) ABSTRACT

A semiconductor heating apparatus, in which, when measuring the electrical properties of multiple chips formed on a large size wafer, only one or a several chips are heated uniformly, and the other chips are on standby at a low temperature. The semiconductor heating apparatus includes a heating part for mounting and heating the workpiece, a support part which supports the heating part, and a cooling module which contacts the support part. A plurality of heating parts and supporting parts are joined together. The workpiece mounting surfaces of the plurality of heating parts are preferably constructed in the same plane. In addition, there is preferably a thermal insulating material distributed underneath the support part. The heating part is preferably a ceramic heater.

20 Claims, 3 Drawing Sheets

SEMICONDUCTOR HEATING APPARATUS

TECHNICAL FIELD

The present invention relates to a semiconductor heating apparatus used in a semiconductor manufacturing device or a semiconductor testing device. In particular, the present relates to a wafer prober or a handler device or the like.

BACKGROUND ART

In the prior art, heat treatment of a semiconductor substrate (wafer) as a workpiece is conducted in a testing step for a semiconductor. In other words, the wafer is heated to a higher temperature than the usual usage temperature, and any semiconductor chips which have the possibility of failing are made to fail at an accelerated rate and are removed. This is a burn-in test in order to prevent the occurrence of failure after shipping. In the burn-in step, after forming a semiconductor circuit on the semiconductor wafer and prior to cutting the individual chips, the electrical performance of each chip is measured while the wafer is being heated. Any defective products are removed. With this burn-in step, there is a strong desire to shorten the processing time in order to improve the through-put.

In addition, after the chips are individually cut and enclosed in a packaging or the like, the semiconductor is similarly heated, and the electrical performance is measured, and defective products are removed. When running electricity through the chips and measuring the electrical properties, the chip generates heat. In recent years, chips have increased in their outputs, with some at 100 W or greater. The chips can be destroyed by their own heat. As a result, after measuring the electrical properties, rapid cooling is necessary.

With this burn-in step, a heater is used for holding the semiconductor substrate and for heating the semiconductor substrate. In the heater of the prior art, the entire undersurface of the wafer must be in contact with the ground electrode, and as a result, metal heaters are used. A wafer on which a circuit is formed is placed on top of a flat, metal heater, and the electrical properties of the chip are measured. During measurement, a measuring device called a probe card, which has a plurality of electrode pins for forming an electrical connection, is pressed against the wafer at a force of several 10's of kgf to several hundred kgf. If the heater is thin, the heater can become deformed, and there may be contact failure between the wafer and the ground electrode. As a result, in order to maintain the rigidity of the heater, a thick metal plate of thickness 15 mm or greater must be used. Raising and lowering the temperature of the heater requires a long time, and this has become a major obstacle in improving throughput.

In Japanese Laid Open Patent Publication Number 2001-033484, a wafer prober is proposed, in which instead of a thick metal plate, a thin metal layer is formed on the surface of a ceramic substrate. Even though it is thin, the ceramic substrate has high rigidity and does not deform readily. As a result, this wafer prober does not readily deform and has a small thermal capacity. According to Japanese Laid Open Patent Publication Number 2001-033484, because of the high rigidity, contact failure does not occur, and because the thermal capacity is small, the temperature is raised and lowered in a short amount of time.

With the burn-in step, the measurement temperature will be different depending on the use of the chip. As an example, electrical properties are measured at a maximum temperature of 200 degrees C. and a minimum temperature of −35 degrees C. Of the multiple chips formed on a wafer, only the chip that is going to have its electrical properties measured needs to be heated to 200 degrees C. However, with the heater of the prior art, such as in Japanese Laid Open Patent Number 2001-033484, the entire wafer is heated, and all of the chips formed on the wafer are heated.

When a chip is exposed to high temperatures for a long period of time, there can be deterioration of properties due to the heat. Preferably, chips that are not being measured do not have their temperatures raised, and only the chip being measured has its temperature raised to the measurement temperature. However, with the heater of the prior art described above, when a plurality of 20 mm square chips are formed on wafers of diameter 200 mm or 300 mm, it is difficult to raise the temperature of a single chip independently. In addition, with the self-generated heat as describe above, not only is that chip damaged, but the surrounding chips may be damaged as well.

DISCLOSURE OF INVENTION

The object of the invention is to solve the above problems. In other words, the object of the present invention is to provide a semiconductor heating apparatus, in which, when measuring the electrical properties of multiple chips formed on a large wafer, one or several chips are heated uniformly, and the other chips are on standby at a low temperature. A further object of the present invention is to provide a semiconductor heating apparatus which has high rigidity, low thermal capacity, with little likelihood of warping, and a metal layer with sufficiently low electrical resistance.

The semiconductor heating apparatus of the present invention comprises a heating part for mounting and heating a workpiece, a support part for supporting the heating part, and a cooling module which contacts the support part. A plurality of heating parts and support parts are joined together. The workpiece mounting surfaces of the plurality of heating parts are preferably constructed in the same plane. In addition, a thermal insulating material is placed underneath the support part.

The heating part is preferably a ceramic heater. The main component of the ceramic heater is at least one type of material selected from the group consisting of aluminum nitride, silicon carbide, silicon nitride, and aluminum oxide.

In addition, a heating element is preferably formed on the inside or on the surface of the heating part. The main component of the heating element is preferably at least one type of material selected from the group consisting of tungsten (W), molybdenum (Mo), platinum (Pt), silver (Ag), palladium (Pd), nickel (Ni), and chromium (Cr).

The thermal conductivity of the support part is preferably 30 W/mK or greater. The main component of the support part is preferably at least one type of material selected from the group consisting of AlN, SiC, $Si_3N_4$, Al—SiC, Si—SiC, Al, Ag, Ni, Cu, CuW, CuMo, W, and Mo.

In addition the thermal conductivity of the thermal insulating material is preferably less than 30 W/mK. The main component of the thermal insulating material is at least one type selected from the group consisting of alumina, mullite, mullite-alumina, and a porous body.

In addition, the support element and the cooling module are preferably mechanically joined. Alternatively, the cooling module is preferably movable so that it can contact and separate from the support element.

In addition, the workpiece mounting surface of the heating part preferably has a metal plate or a metal-ceramic complex. Alternatively, the workpiece mounting surface of the heating part is preferably treated with a metal. The metal treatment is plating, and the plating is preferably nickel plating or gold plating.

In addition, preferably, a plurality of heating parts is joined together, and the metal from the metal treatment of the workpiece mounting surfaces of the heating parts are electrically connected with each other. In addition, preferably, a plurality of the heating parts is joined together, and by having reduced pressure or a vacuum in the space between the individual heating parts, the workpiece is attached by the vacuum pressure to the workpiece mounting surface.

In addition, the workpiece mounting surface of the heating part preferably has a coating of diamond or DLC (diamond-like coating).

The semiconductor heating apparatus of the present invention is useful in a wafer prober, handler, or tester.

BEST MODE FOR CARRYING OUT THE INVENTION

Figure 1:
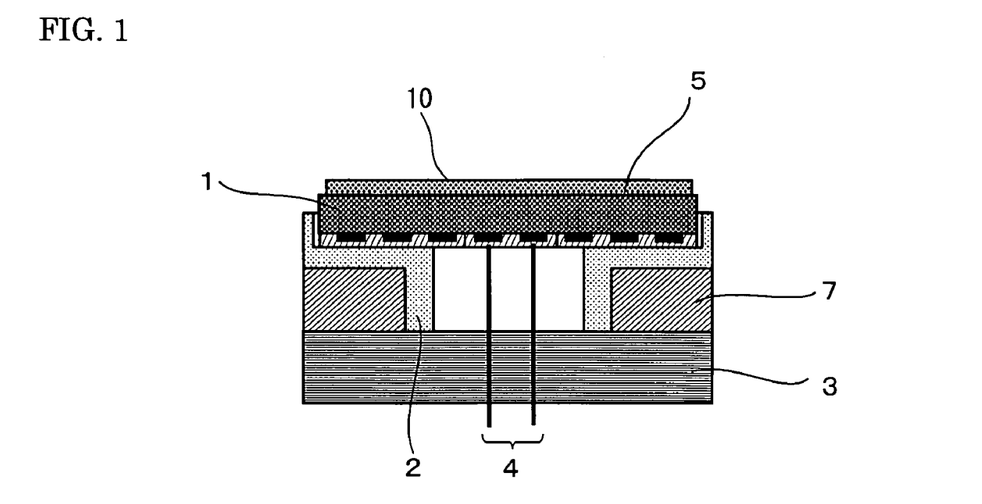
FIG. 1 is a schematic cross-sectional diagram of a heating apparatus of the present invention.

Referring to FIG. 1, an implementation mode of the present invention is described. Referring to FIG. 1, there is one example of an implementation mode of the present invention. The semiconductor heating apparatus comprises a heating part 1 for mounting a workpiece 10, a support part 2 for supporting heating part 1, and a cooling module 3 which contacts support part 2. Because the heating part directly heats the workpiece, it is possible to raise the temperature of the workpiece rapidly. In addition, because the heating part is thermally connected to the cooling module via the support part, rapid cooling of the workpiece is also possible. The heating apparatus can rapidly heat and rapidly cool the workpiece.

Figure 2:
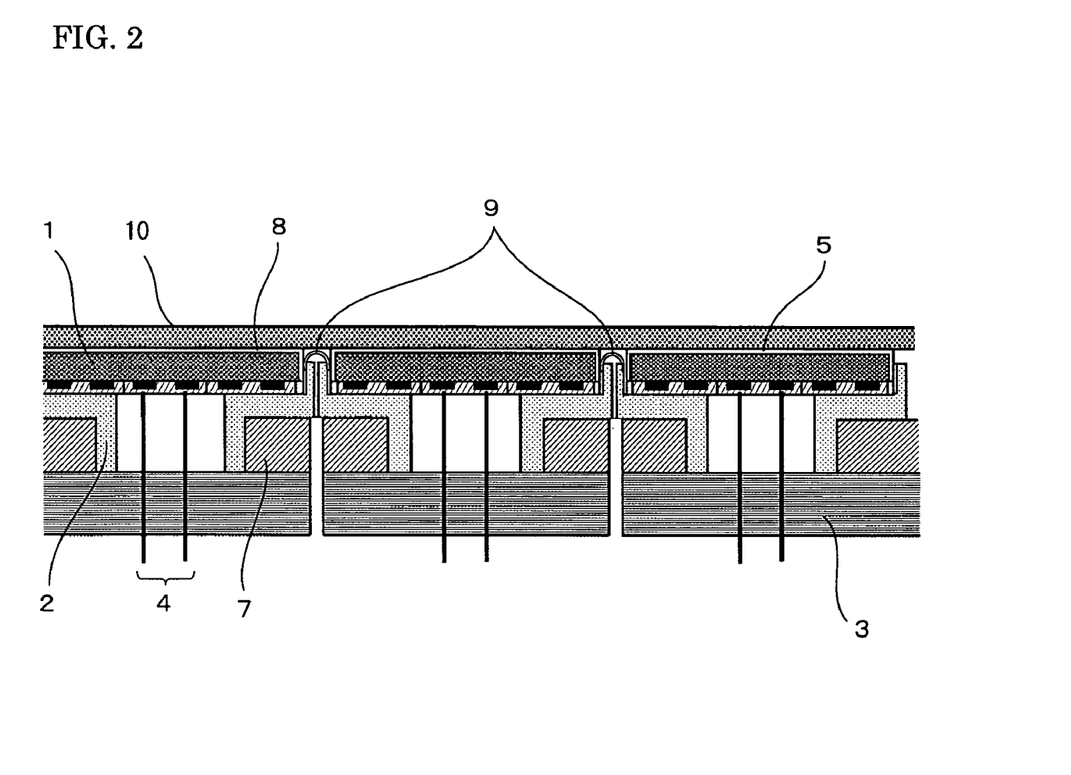
FIG. 2 is a schematic cross-sectional diagram of another heating apparatus of the present invention.

In addition, as shown in FIG. 2, a plurality of heating parts 1 and support parts 2 are joined together, and workpiece mounting surfaces 5 for the heating parts are constructed in the same plane. By joining together a plurality of heating parts which have smaller areas than the area of the workpiece, a section of the workpiece can be heated by each heating part.

In addition, as shown in FIG. 2, by providing a space 6 between support parts and placing a thermal insulating material 7, the thermal isolation between the heating parts is increased. By having this construction, the interaction between heating parts is eliminated. As a result, individual heating parts can be more easily controlled independently.

In addition, the heating part is preferably a ceramic. By having the heating part formed from a ceramic, a higher rigidity is achieved as compared to metal. As a result, even when pressed with a wafer probe card or the like, the heating part does not readily deform. Insulation, thermal resistance, and durability are also improved. The main component of the ceramic is preferably at least one type of material selected from the group consisting of: aluminum nitride, silicon carbide, silicon nitride, and aluminum oxide. Compared to other ceramics, these ceramics have excellent rigidity, insulation, thermal resistance, and durability.

A heating element is preferably formed on the inside or on the surface of the ceramic described above. Because the heating part is a ceramic with a heating element, the heat generated by the heating element is used for heating the workpiece without waste. As a result, thermal uniformity and thermal efficiency are improved. By forming the heating element inside the ceramic, deterioration of the heating element such as by oxidation and the like is prevented. In addition, by forming the heating element on the surface of the ceramic, a low-cost heating part is formed. When the heating element is formed on the surface of the ceramic, the heating element can be covered with an insulating material such as glass or the like as needed.

In addition, from the standpoint of electrical resistance, thermal resistance, and durability, the main component of the heating element is preferably one or more types of material selected from the group consisting of W, Mo, Pt, Ag, Pd, Ni, and Cr. Examples include a single substance W, Mo, Pt, and the like or Ag—Pd, Ni—Cr, and the like.

The support part is preferably a material with a thermal conductivity of 30 W/mK or greater. By having the thermal conductivity 30 W/mK or greater, the diffusion of heat to the cooling module is conducted rapidly, and cooling rate is improved. The main component of this support part is preferably at least one type of material selected from a group consisting of AlN, SiC, $Si_3N_4$, Al—SiC, Si—SiC, Al, Ag, Ni, Cu, CuW, CuMo, W, and Mo.

The thermal insulating material is preferably a material with a thermal conductivity of less than 30 W/mK. By having a material with a thermal conductivity of less than 30 W/mK, the thermal insulating effect is increased, and the control of heating for each heating part becomes easier. Examples of thermal insulating material include alumina with a thermal conductivity of 20 W/mK, mullite with a thermal conductivity of 1 W/mK, mullite-alumina with a thermal conductivity of 5 W/mK, and a porous body with a thermal conductivity of 0.1-1W/mK. By using these materials with low thermal conductivity, the heating of each heating part is controlled more readily, and in addition, the heating apparatus has excellent rigidity, thermal resistance, and durability.

In addition, the support element and the cooling module can be joined mechanically. Mechanical joining includes attachment with screws, soldering, forming a linkage, and fitting together. With mechanical joining, the cooling module and supporting element are placed in tight contact. As a result, the thermal resistance between the cooling module and the support element is reduced, and cooling rate is improved. In addition, by mechanically joining them together, the construction of the heating apparatus is more stable.

Figure 3:
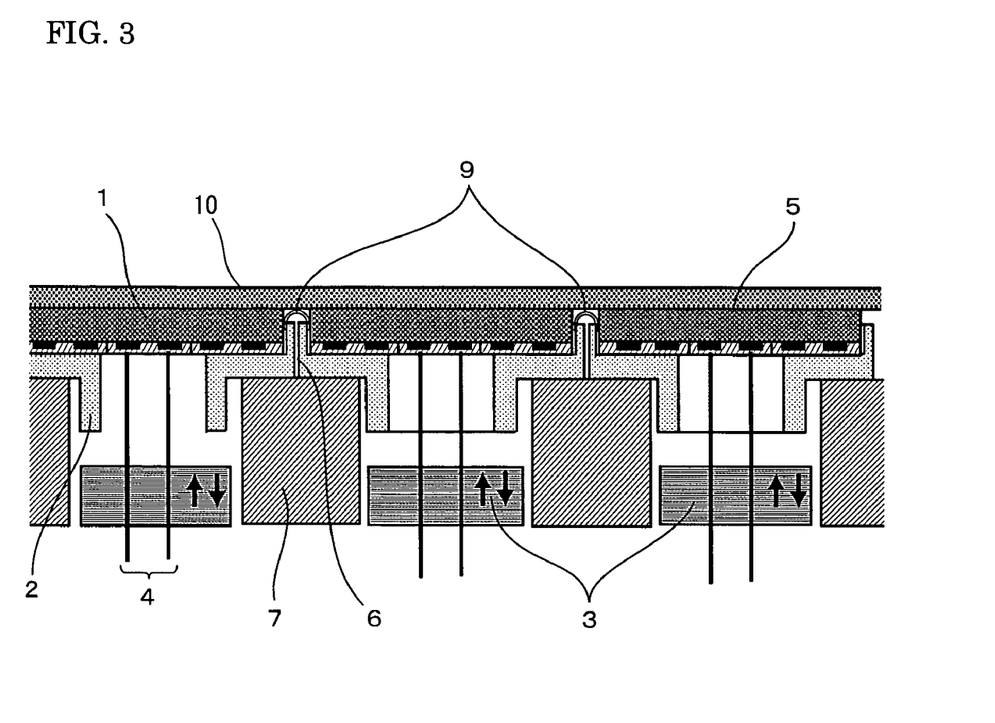
FIG. 3 is a schematic cross-sectional diagram of another heating apparatus of the present invention.

In addition, as shown in FIG. 3, the cooling module can be attached in a movable manner by a raising and lowering means (not shown) so that the cooling module can contact and separate from the support element. When raising the temperature, the cooling module is separated so that heat is not lost to the cooling module. As a result, the rate of temperature rise is improved, and electrical power is conserved. In addition, during cooling, by having the cooling block contact the support element, the rate of cooling is increased. Because during heating, the heating part is separated from the cooling block, the support element is contacted with a cooling block which is sufficiently cool. As a result, the rate of cooling is improved even further.

In addition, when the undersurface of the workpiece is connected electrically to outside of the system, the workpiece mounting surface of the heating part can have a metal plate or metal-ceramic composite element. Alternatively, the workpiece mounting surface of the heating part can be treated with metal. The metal treatment is preferably plating because of its low cost and reliable metallization. Plating is preferably nickel plating and/or gold plating. By having nickel plating and/or gold plating, there is excellent oxidation resistance of the metallized surface, and there can be a long-term, stable electrical connection.

Figure 4:
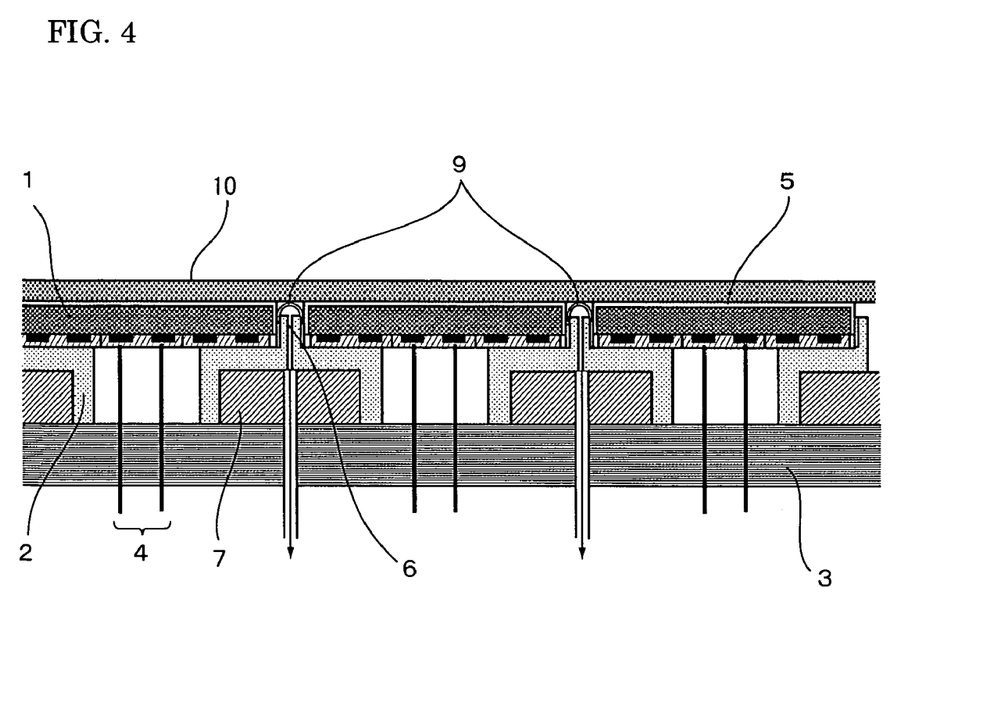
FIG. 4 is a schematic cross-sectional diagram of another heating apparatus of the present invention.

Furthermore, as shown in FIG. 4, a plurality of heating parts 1 are joined together, and the metal 8 of the metal treatment of workpiece mounting surface 5 of the heating part are preferably electrically connected with each other by an electrical circuit 9 for electrical conduction. Electrical circuit 9 is a metal clip or metal foil or the like. By doing so, the metallized surface of the heating part and the outside of the system do not have to be electrically connected individually, and the circuit is simplified.

Figure 5:
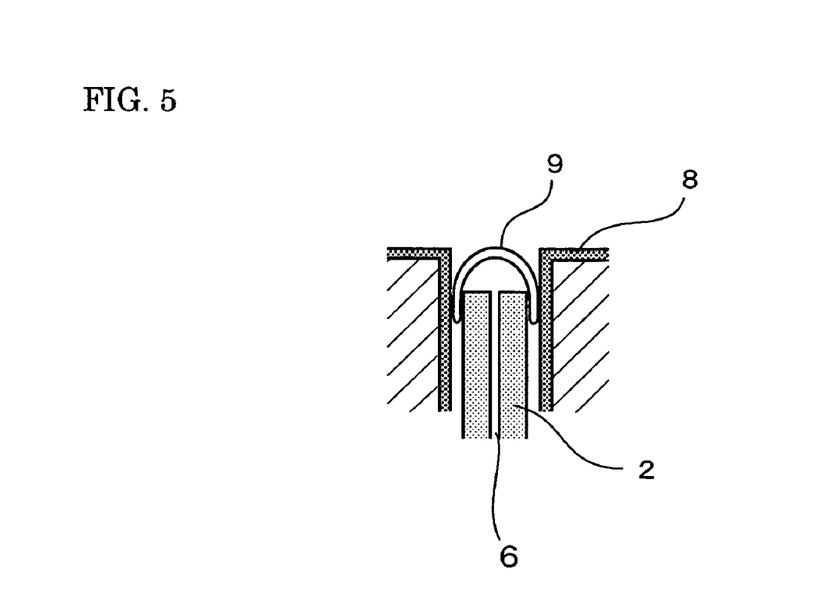
FIG. 5 is one example of an electrical connection method for the present invention.

In addition, as shown in FIG. 5, several heating parts and support parts are joined together, and holes are opened in thermal insulating material 7. These holes lead to space 6 provided between the individual heating parts and support parts. Space 6 has reduced pressure or is made into a vacuum, so that the workpiece is attached to the workpiece mounting surface by suction. By having the workpiece attached to the heating part by suction, the thermal resistance between the workpiece and the heating part is reduced. Rapid warming and rapid cooling becomes easier. In addition, there is no need to provide separate holes for suction attachment, and the construction of the heating apparatus becomes simpler, and costs can be reduced. The reliability of the construction is also improved.

In addition, when measuring the electrical properties of the chip by a wafer prober, the chip may generate heat. The chip could deteriorate due to the heat generated by the chip. In order to prevent this, there is preferably a diamond or DLC (diamond like carbon) coating on the workpiece mounting surface. The diamond or DLC has a high thermal conductivity, and the heat generated by the chip is quickly diffused, and deterioration of the chip is prevented. Diamond or DLC can be conductive or non-conductive with no change in their effect.

The semiconductor heating apparatus of the present invention can be used in semiconductor manufacturing devices and semiconductor testing devices. Alternatively, the present invention can also be used in the field of liquid crystal panel manufacturing devices, and the like. The present invention is particularly useful in wafer probers, handlers, and testers. These devices conduct testing of silicon wafers of diameter 300 mm with circuitry formation, and they can conduct testing of semiconductor chips sealed in packages.

Embodiment 1

100 parts by weight of aluminum nitride (AlN) powder and 0.5 parts by weight of yttrium oxide ($Y_2O_3$) powder were mixed. Polyvinyl butyral as a binder and dibutyl phthalate as a solvent were mixed at 10 parts by weight and 5 parts by weight, respectively. Granules were created by spray drying. After sintering and then polishing, these were press molded to obtain 32 sintered bodies the size of 38 mm×38 mm×2 mm. These were degreased at a temperature of 700 degrees C. in a nitrogen atmosphere, and these were sintered for 5 hours in a nitrogen atmosphere at 1850 degrees C., and 32 AlN sintered bodies were created. These AlN sintered bodies were processed and finished to a size of 38 mm×38 mm×2 mm. The thermal conductivity of the AlN sintered bodies was 175 W/mK.

On the 38 mm×38 mm surface of the AlN sintered body, the heating element circuit was screen printed using a W paste. The W paste was created by adding glass powder and an ethyl cellulose binder for calcination to W powder of average grain size 2.0 micrometers and kneading. Afterwards, degreasing was conducted at 900 degrees C. in a nitrogen atmosphere. Sintering was conducted in a nitrogen atmosphere at 1800 degrees C. for 1 hour. With the exception of the temperature measurement device attachment part and an electric feed part, the surface having the heating element circuit was coated with a glass paste of $B_2O_3$—$Al_2O_3$ at a thickness of 50 micrometers, and this was sintered under a nitrogen atmosphere at 700 degrees C.

As shown in FIG. 1, an electrode terminal made of W was directly joined to the electric feed part using gold soldering. Furthermore, a Ni electrode 4 was screwed onto the W terminal, and a K thermocouple (not shown) for temperature measurement was attached, and 32 of the AlN heating parts 1 were completed. The surface on the opposite side as the heat generating circuit of the AlN heater is the workpiece mounting surface. The workpiece mounting surface was plated with Ni.

In addition, the AlN granules obtained by spray drying as described above were sintered and then were press molded into 39 mm×39 mm×20 mm. They were similarly degreased and sintered as described above, and 32 of the AlN sintered bodies were created. The thermal conductivity of the AlN sintered bodies was 175 W/mK. These AlN sintered bodies were processed into the shape of support part 2 shown in FIG. 1.

100 parts by weight of mullite powder and 0.5 parts by weight of yttrium oxide ($Y_2O_3$) powder were mixed. Polyvinyl butyral as a binder and dibutyl phthalate as a solvent were mixed at 10 parts by weight and 5 parts by weight, respectively. Granules were created by spray drying. After sintering and then polishing, these were press molded to obtain 32 sintered bodies the size of 20 mm×20 mm×10 mm. These were degreased at 500 degrees C. in the atmosphere. These were sintered for 3 hours at 1700 degrees C. in a nitrogen atmosphere, and 32 mullite sintered bodies were created. These mullite sintered bodies were processed to complete a thermal insulating material 7 of a size 20 mm×20 mm×10 mm. The thermal conductivity of these mullite sintered bodies was 1 W/mK.

As shown in FIG. 2, the 32 heating parts 1, supports 2, and thermal insulating materials 7 described above were joined with copper cooling modules 3. Support part 2 and cooling module 3 were attached with screws. The Ni electrodes 4 of the 32 heating parts 1 were connected with an external power source (not shown). They were connected so that each of the 32 heating parts 1 could be heated independently. In addition, as shown in FIG. 5, the Ni platings 8 were electrically connected with each other with a spring of Ni foil 9 of 2 mm×2 mm×0.5 mm, and these were connected with a ground. The heating apparatus was completed.

This heating apparatus was used as a wafer prober. A Si wafer with a circuit formation and a diameter of 300 mm was mounted. Only the heating part for the area corresponding to the chip having its electrical properties measured by the probe card had current running through it to raise the temperature to 200 degrees C. Galden at −35 degrees was run through the cooling module. As a result, only the chip to be measured achieved a uniform heat of 200 degrees C.±0.5 degrees C. The chips surrounding this chip were at temperatures of 50 degrees C. or below. After measuring the electrical properties, when moving to the next chip, current was passed through the heating part corresponding to this next chip, and the passing of current in the heating part corresponding to the chip whose measurements were completed was stopped. The temperature for the heating part 1 minute after stopping current flow was 50 degrees C. With the part in which current flow was initiated, the temperature was 200 degrees C.±0.5 degrees C. in 1 minute. With 1000 chips which had their electrical properties measured in this way and which were judged to be good, an accelerated deterioration test of 1000 hours was conducted, but there were no deteriorated chips.

Comparative Example

Figure 6:
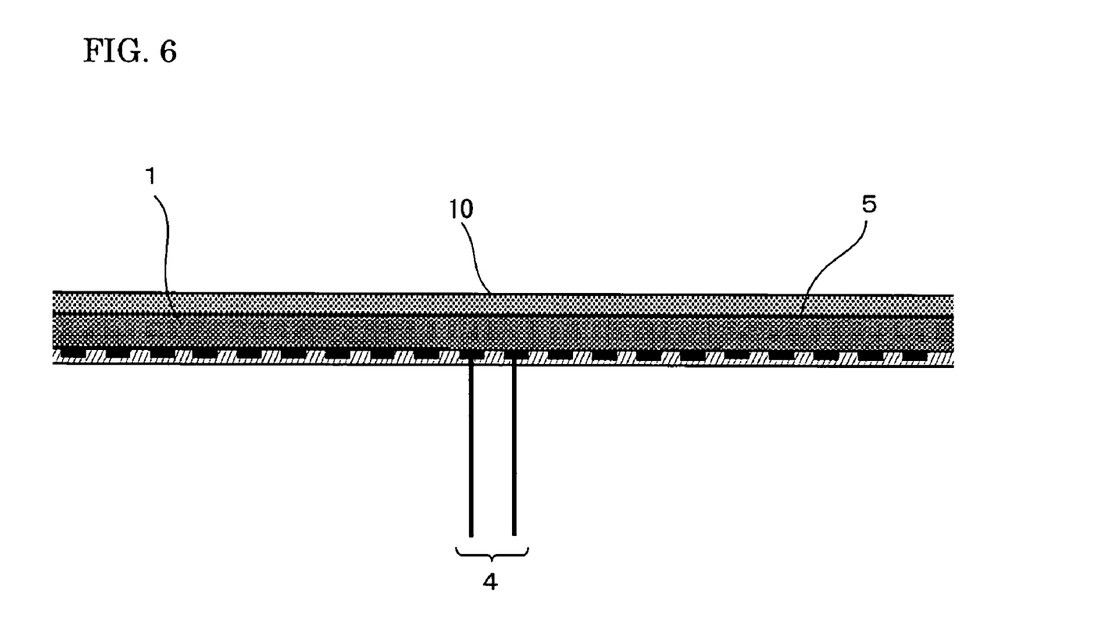
FIG. 6 is a schematic cross-section of a heating apparatus of the prior art.

As a comparison, an AlN sintered body was created in the same manner as Embodiment 1, except that after sintering, it was pressed into a diameter 310 mm and thickness 10 mm. A heating element and electrode 4 were formed in the same manner as in Embodiment 1. As shown in FIG. 6, a heating apparatus only having a heating part 1 made of AlN was created. As with Embodiment 1, this heating apparatus was used as a wafer prober, and a wafer was mounted. In order to measure the electrical properties with a probe card, this was heated to 200 degrees C. The temperature distribution was 200±1 degrees C. over the entire surface. All of the chips formed on the wafer were heated to 200 degrees C. until measurements were completed.

With the 1000 chips which had their electrical properties measured and were judged to be good, when 1000 hours of an accelerated deterioration test were conducted, 5 chips had deteriorated.

Embodiment 2

100 parts by weight of SiC powder, 1.0 part by weight of boron carbide ($B_4C$), and 1.0 part by weight of carbon (C) powder were mixed. Polyvinyl butyral as a binder and dibutyl phthalate as a solvent were mixed at 10 parts by weight and 5 parts by weight, respectively. Granules were created by spray drying. After sintering and polishing, these were press molded to obtain 38 mm×38 mm×2 mm sintered bodies. These were degreased at 700 degrees C. in an argon atmosphere. These were sintered for 5 hours at 1920 degrees C. in an argon atmosphere to create 32 SiC sintered bodies. These SiC sintered bodies were processed and completed to be 38 mm×38 mm×2 mm. The thermal conductivity of the SiC sintered bodies was 150 W/mK. As in Embodiment 1, heating circuits were formed on these SiC sintered bodies, and W terminals and Ni electrodes were attached. The SiC heating parts were completed.

The heating apparatus was completed in the same manner as in Embodiment 1 except for the 32 heating parts, and evaluation was conducted as in Embodiment 1. For the results, the parts with current flow had a temperature of 200±0.6 degrees C., and surrounding parts were 50 degrees C. As in Embodiment 1, when switching the sites of current flow, 1.5 minutes after switching, the area of current flow was 200 degrees C.±0.6 degrees C., and the surrounding parts were 50 degrees C. In addition, as in Embodiment 1, with 1000 chips which had their electrical properties measured and were judged to be good, 1000 hours of accelerated deterioration test were conducted, but there were no deteriorated chips.

Embodiment 3

100 parts by weight of $Si_3N_4$ powder, 1.0 part by weight of $Y_2O_3$ powder, and 1.0 part by weight of $Al_2O_3$ powder were mixed. Polyvinyl butyral as a binder and dibutyl phthalate as a solvent were mixed at 10 parts by weight and 5 parts by weight, respectively. Granules were created by spray drying. After sintering and polishing, these were press molded to obtain 38 mm×38 mm×2 mm sintered bodies. These were degreased at 700 degrees C. in a nitrogen atmosphere. These were sintered for 5 hours at 1650 degrees C. in a nitrogen atmosphere to create 32 $Si_3N_4$ sintered bodies. These $Si_3N_4$ sintered bodies were processed and completed to be 38 mm×38 mm×2 mm. The thermal conductivity of the $Si_3N_4$ sintered bodies was 80 W/mK. As in Embodiment 1, heating circuits were formed on these $Si_3N_4$ sintered bodies, and W terminals and Ni electrodes were attached. The $Si_3N_4$ heating parts were completed.

The heating apparatus was completed in the same manner as in Embodiment 1 except for the 32 heating parts, and evaluation was conducted as in Embodiment 1. For the results, the parts with current flow had a temperature of 200±0.65 degrees C., and surrounding parts were 50 degrees C. As in Embodiment 1, when switching the sites of current flow, 2 minutes after switching, the area of current flow was 200 degrees C.±0.65 degrees C., and the surrounding parts were 50 degrees C. In addition, as in Embodiment 1, with 1000 chips which had their electrical properties measured and were judged to be good, 1000 hours of accelerated deterioration test were conducted, but there were no deteriorated chips.

Embodiment 4

100 parts by weight of $Al_2O_3$ powder and 2.0 parts by weight of magnesium oxide (MgO) were mixed. Polyvinyl butyral as a binder and dibutyl phthalate as a solvent were mixed at 10 parts by weight and 5 parts by weight, respectively. Granules were created by spray drying. After sintering and polishing, these were press molded to obtain 38 mm×38 mm×2 mm sintered bodies. These were degreased at 500 degrees C. in atmosphere. These were sintered for 4 hours at 1550 degrees C. in atmosphere to create 32 $Al_2O_3$ sintered bodies. These $Al_2O_3$ sintered bodies were processed and completed to be 38 mm×38 mm×2 mm. The thermal conductivity of the $Al_2O_3$ sintered bodies was 30 W/mK. As in Embodiment 1, heating circuits were formed on these $Al_2O_3$ sintered bodies, and W terminals and Ni electrodes were attached. The $Al_2O_3$ heating parts were completed.

The heating apparatus was completed in the same manner as in Embodiment 1 except for the 32 heating parts, and evaluation was conducted as in Embodiment 1. For the results, the parts with current flow had a temperature of 200±0.8 degrees C., and surrounding parts were 50 degrees C. As in Embodiment 1, when switching the sites of current flow, 3 minutes after switching, the area of current flow was 200 degrees C±0.8 degrees C., and the surrounding parts were 50 degrees C. In addition, as in Embodiment 1, with 1000 chips which had their electrical properties measured and were judged to be good, 1000 hours of accelerated deterioration test were conducted, but there were no deteriorated chips.

Embodiment 5

With the material for the support part of Embodiment 1, $Y_2O_3$ powder was not added to the AlN powder, and $Al_2O_3$ powder was added to make an AlN sintered body with a thermal conductivity shown in Table 1. The AlN sintered body was created by hot pressing at 9.8 MPa. Except for the support part, a heating apparatus was completed in the same manner as Embodiment 1. As in Embodiment 1, when the current flow site was switched, the time for cooling from 200 degrees C. to 50 degrees C. was measured. The results are shown in Table 1.

TABLE 1

| No. | Thermal conductivity (W/mK) | Cooling time (minutes) |
| --- | --- | --- |
| 1 | 175 | 1 |
| 2 | 80 | 6 |
| 3 | 50 | 7 |
| 4 | 30 | 10 |
| 5 | 20 | 30 |
| 6 | 10 | 60 |

As can be seen from Table 1, the higher the thermal conductivity of the support element, the shorter the cooling time. For practical use, the cooling time to 50 degrees C. is preferably within 10 minutes. As a result, the thermal conductivity of the support element is preferably 30 W/mK or greater.

Embodiment 6

Instead of W for the heating element of Embodiment 1, M, Pt, Ag—Pd, Ni—Cr were used. Apart from this, heating apparatuss as described in Embodiment 1 were created. When heated in the same manner as Embodiment 1, all of the heating elements became 200±0.5 degrees C., and no problems were seen.

Embodiment 7

Instead of the support element of Embodiment 1, materials having the thermal conductivities shown in Table 2 were used. Apart from this, heating apparatuss like those of Embodiment 1 were created. As in Embodiment 1, when the current flow site was switched, the cooling times from 200 degrees C. to 50 degrees C. was measured. The results are shown in Table 2. With all of the materials, it was confirmed that there were no problems in terms of practical use.

TABLE 2

| No. | Material | Thermal conductivity (W/mK) | Cooling time (seconds) |
| --- | --- | --- | --- |
| 7 | SiC | 150 | 90 |
| 8 | $Si_3N_4$ | 80 | 360 |
| 9 | Al—SiC | 200 | 50 |
| 10 | Si—SiC | 220 | 45 |
| 11 | W | 120 | 95 |
| 12 | Mo | 110 | 95 |
| 13 | Ni | 95 | 340 |
| 14 | Cu | 403 | 30 |
| 15 | Al | 236 | 40 |
| 16 | Ag | 440 | 25 |

Embodiment 8

Instead of the thermal insulating material of Embodiment 1, materials having the thermal conductivities shown in Table 3 were used. Apart from this, heating apparatuss like those of Embodiment 1 were created. As in Embodiment 1, with current flow, the current flow site was 200±0.5 degrees C., however, the temperature of the surrounding chips were as shown in Table 3.

TABLE 3

| No. | Material | Thermal conductivity (W/mK) | Temperature (degrees C.) |
| --- | --- | --- | --- |
| 17 | Mullite | 1 | 60 |
| 18 | Alumina | 25 | 95 |
| 19 | Mullite-alumina | 5 | 80 |
| 20 | Mullite porous body | 0.1 | 52 |
| 21 | $Si_3N_4$ | 80 | 180 |

Deterioration progresses with chips that are maintained at temperatures exceeding 150 degrees C. for a long time. Therefore, chips other than the chip that is being measured is preferably maintained at a temperature of 100 degrees C. or lower. Therefore, the thermal conductivity of the thermal insulating material is preferably less than 30 W/mK.

Embodiment 9

Instead of affixing the support element and the cooling module with screws as in Embodiment 1, the support element and cooling module were soldered together, fitted together, or not affixed but simply placed one on top of the other. Apart from this, heating apparatuss like those of Embodiment 1 were created. As in Embodiment 1, when current flow sites were switched, the cooling times from 200 degrees C. to 50 degrees C. were measured. The cooling times were 50 seconds, 80 seconds, and 12 minutes, respectively. By mechanically joining together the support element and cooling module such as by screws or soldering and the like, the cooling times were shortened.

Embodiment 10

As shown in FIG. 3, the cooling modules and the individual heating parts were made into approximately the same size, and using a means for raising and lowering (not shown), the cooling module was made to be movable so that it could contact and separate from the heating part. Apart from this, a heating apparatus like that of Embodiment 1 was created. When raising the temperature, the cooling module was separated from the support part by 10 mm. When cooling, the cooling module contacted the support part. The warming time from 50 degrees C. to 200 degrees C. was 50 seconds, and the cooling time from 200 degrees C. to 50 degrees C. was 40 seconds. In Embodiment 1, the warming time was 70 seconds, and the cooling time was 60 seconds. The warming time and cooling time were faster than in Embodiment 1.

Embodiment 11

Instead of applying plating onto the workpiece mounting surface of the AlN sintered body of Embodiment 1, an Ni plate or Al—SiC plate of thickness 1 mm was placed as a conductive element on the workpiece mounting surface, and Ni foil leaves were soldered in order to electrically connect the conductive elements. Apart from this, heating apparatuss like those of Embodiment 1 were created. These were used as wafer probers, and neither had problems in electrically connecting the wafer undersurface with the outside of the system.

Embodiment 12

Instead of Ni plating, Au plating was applied onto the workpiece mounting surface of the AlN sintered body of Embodiment 1. Apart from this, a heating apparatus like that of Embodiment 1 was created. This was used as a wafer prober, and there was no problem in electrically connecting the undersurface of the wafer with outside of the system.

Embodiment 13

As shown in FIG. 4, using a space 6 between the heating part and the support element, the workpiece was attached by vacuum suction. The temperature was raised as in Embodiment 1, and the electrical properties were measured. The thermal uniformity was improved to 200 degrees C.±0.3 degrees C. By attaching the workpiece by vacuum suction, the workpiece and the heating part are held tightly together. As a result, it is thought that because the thermal conductivity becomes uniform, thermal uniformity is improved.

Embodiment 14

A further Au plating was applied on top of the Ni plating of the AlN sintered body of Embodiment 1. Apart from this, a heating apparatus like that of Embodiment 1 was created. This was heated as in Embodiment 1, and the electrical properties were measured. The same results as in Embodiment 1 were obtained. When the heating apparatus of Embodiment 1 was used for 1000 hours in the atmosphere at 200 degrees C., there was a small amount of oxidation on the surface of the heating apparatus, and the surface of the heating apparatus became dull. However, with this heating apparatus, there was no dulling of the surface.

Embodiment 15

Instead of Ni plating of the AlN sintered body of Embodiment 1, there was a conductive diamond coating. Electrical connections as in Embodiment 1 were conducted, and a heating apparatus was created. With Embodiment 1, when measuring the electrical properties with a probe card, the chip generated heat instantaneously, and there was a heat flicker. However, when there was a conductive diamond coating, the heat was instantaneously dissipated, and there was no heat flicker.

Embodiment 16

Instead of Ni plating of the AlN sintered body of embodiment 1, there was a conductive DLC (diamond like carbon) coating. Electrical connections as in Embodiment 1 were conducted, and a heating apparatus was created. With Embodiment 1, when measuring the electrical properties with a probe card, the chip generated heat instantaneously, and there was a heat flicker. However, when there was a conductive DLC coating, the heat was instantaneously dissipated, and there was no heat flicker.

INDUSTRIAL APPLICABILITY

According to the present invention, when measuring the electrical properties of multiple chips formed on a large size wafer, only one or a few of the chips are heated uniformly, and the other chips are on standby at a low temperature. For example, when measuring the electrical properties with a probe card, because all of the chips are not kept at a high temperature for a long period of time, the deterioration of chip due to high temperature exposure is prevented. In addition, the present invention is a semiconductor heating apparatus with high rigidity, low thermal capacity. There is little likelihood of warping, and the electrical resistance of the metal layer is sufficiently low. The present invention is useful in wafer probers, handlers, and testers.

What is claimed is:

1. A semiconductor heating apparatus comprising:
a heating part for mounting and heating a workpiece;
a support part for supporting said heating part; and
a cooling module which contacts said support part;
wherein:
a plurality of said heating parts and a plurality of said support parts are joined together,
workpiece mounting surfaces for said plurality of heating parts are constructed in a single plane, and
said support part supports said heating part and is located above said cooling module.

2. A semiconductor heating apparatus as described in claim 1, wherein: a thermal insulating material is placed underneath said support part.

3. A semiconductor heating apparatus as described in claim 2 wherein: thermal conductivity of said thermal insulating material is less than 30 W/mK.

4. A semiconductor heating apparatus as described in claim 3, wherein: a main component of said thermal insulating material is at least one type selected from the group consisting of alumina, mullite, mullite-alumina, and a porous body.

5. A semiconductor heating apparatus as described in claim 1, wherein: said heating part is a ceramic.

6. A semiconductor heating apparatus as described in claim 5, wherein: a main component of said ceramic is a material of at least one type selected from the group consisting of aluminum nitride, silicon carbide, silicon nitride, and aluminum oxide.

7. A semiconductor heating apparatus as described in claim 5, wherein: a heating element is formed inside of or on a surface of said heating part.

8. A semiconductor heating apparatus as described in claim 7, wherein: a main component of said heating element is at least one type of material selected from the group consisting of tungsten (W), molybdenum (Mo), platinum (Pt), silver (Ag), palladium (Pd), nickel (Ni), and chromium (Cr).

9. A semiconductor heating apparatus as described in claim 1, wherein: thermal conductivity of said support part is 30 W/mK or greater.

10. A semiconductor heating apparatus as described in claim 9, wherein: a main component of said support part is at least one type selected from the group consisting of AlN, SiC, $Si_3N_4$, Al—SiC, Si—SiC, Al, Ag, Ni, Cu, CuW, CuMo, W, and Mo.

11. A semiconductor heating apparatus as described in claim 1, wherein: said support element and said cooling module are mechanically joined.

12. A semiconductor heating apparatus as described in claim 1, wherein: said cooling module is movable so that it can contact with and separate from said support element.

13. A semiconductor heating apparatus as described in claim 1, wherein: a metal plate or a metal-ceramic composite is placed on a workpiece mounting surface of said heating part.

14. A semiconductor heating apparatus as described in claim 1, wherein: a workpiece mounting surface of said heating part has a metal treatment.

15. A semiconductor heating apparatus as described in claim 14, wherein: said metal treatment is plating treatment.

16. A semiconductor heating apparatus as described in claim 15, wherein: said plating is nickel plating and/or gold plating.

17. A semiconductor heating apparatus as described in claim 14, wherein: a plurality of said heating parts are joined together; metal from the metal treatment of said workpiece mounting surfaces of said heating parts are electrically connected with each other.

18. A semiconductor heating apparatus as described in claim 1, wherein: a plurality of said heating parts are joined together; spaces provided between said individual heating parts have reduced pressure or are made into a vacuum, and said workpiece is attached by vacuum suction to said workpiece mounting surface of said heating part.

19. A semiconductor heating apparatus as described in claim 1, wherein: there is a diamond or DLC (diamond-like carbon) coating on said workpiece mounting surface of said heating part.

20. A semiconductor heating apparatus as described in claim 1, wherein: said semiconductor heating apparatus is used in a wafer prober, a handler, or a tester.

* * * * *